(12) United States Patent
Tillman

(10) Patent No.: US 9,800,357 B2
(45) Date of Patent: Oct. 24, 2017

(54) MODULAR PLATFORM FOR CREATION AND MANIPULATION OF AUDIO AND MUSICAL SIGNALS

(71) Applicant: John Donald Tillman, Palo Alto, CA (US)

(72) Inventor: John Donald Tillman, Palo Alto, CA (US)

(*) Notice: Subject to any disclaimer, the term of this patent is extended or adjusted under 35 U.S.C. 154(b) by 0 days.

(21) Appl. No.: 15/052,783

(22) Filed: Feb. 24, 2016

(65) Prior Publication Data

US 2016/0301488 A1    Oct. 13, 2016

Related U.S. Application Data

(60) Provisional application No. 62/144,337, filed on Apr. 8, 2015.

(51) Int. Cl.
| | | |
|---|---|---|
| *H04H 60/05* | (2008.01) | |
| *H04H 60/04* | (2008.01) | |
| *H04H 60/58* | (2008.01) | |
| *H03G 3/30* | (2006.01) | |
| *H04R 3/12* | (2006.01) | |
| *G10H 7/00* | (2006.01) | |
| *G10H 1/00* | (2006.01) | |
| *G10H 1/06* | (2006.01) | |
| *H03G 1/00* | (2006.01) | |
| *H04R 27/00* | (2006.01) | |

(Continued)

(52) U.S. Cl.
CPC ............ *H04H 60/05* (2013.01); *H04H 60/04* (2013.01); *H04H 60/58* (2013.01); *G10H 1/0091* (2013.01); *G10H 1/06* (2013.01); *G10H 1/32* (2013.01); *G10H 3/186* (2013.01); *G10H 7/00* (2013.01); *G10H 2220/116* (2013.01); *G10H 2250/471* (2013.01); *H03G 1/0088* (2013.01); *H03G 3/3026* (2013.01); *H04R 3/12* (2013.01); *H04R 27/00* (2013.01); *H04R 2227/005* (2013.01)

(58) Field of Classification Search
CPC .... H04H 60/05; H03G 1/0088; H03G 3/3026; G10H 3/186; G10H 1/0091; G10H 2220/116; G10H 2250/471; G10H 1/32; G10H 1/06; G10H 7/00; H04R 2227/005; H04R 27/00; H04R 3/12
See application file for complete search history.

(56) References Cited

U.S. PATENT DOCUMENTS 5,130,662 A * 7/1992 Jorgensen ............... H04H 60/04
330/51
5,384,854 A * 1/1995 Downs ................... H04H 60/04
379/203.01

(Continued)

OTHER PUBLICATIONS

Digital Mixers, X32Rack,2013.*
M-audio, Profire 2626, user guide, 2010.*

*Primary Examiner* — Davetta W Goins
*Assistant Examiner* — Kuassi Ganmavo
(74) *Attorney, Agent, or Firm* — Perkins Coie LLP

(57) ABSTRACT

A platform for audio and electronic music applications where the electronics are implemented as modules, and the modules mount in a cabinet with a common power supply and infrastructure. The platform addresses problems in electrical, mechanical, usability, and power distribution areas, and is suitable for guitar effects, synthesizers, studio equipment, and DJ gear.

20 Claims, 9 Drawing Sheets

(51) Int. Cl.
*G10H 3/18* (2006.01)
*G10H 1/32* (2006.01)

(56) References Cited

U.S. PATENT DOCUMENTS

| | | | | |
|---|---|---|---|---|
| 5,440,644 A * | 8/1995 | Farinelli | | H04M 1/723 381/81 |
| 5,784,015 A * | 7/1998 | Frindle | | H04H 60/04 341/118 |
| 6,504,936 B1 * | 1/2003 | Gutierrez | | H04R 27/00 361/600 |
| 6,804,504 B1 * | 10/2004 | Johnson | | H04H 60/04 381/394 |
| 6,813,361 B1 * | 11/2004 | Jeffs | | H04H 60/04 369/4 |
| 6,892,350 B1 * | 5/2005 | Oba | | H03J 1/0016 715/716 |
| 7,158,843 B2 * | 1/2007 | Smith | | H04R 3/00 381/120 |
| 8,221,159 B2 * | 7/2012 | Knepp | | H04H 60/04 439/49 |
| 2003/0084277 A1 * | 5/2003 | Przywara | | G10L 19/00 713/1 |
| 2007/0263884 A1 * | 11/2007 | Bedingfield, Sr. | | H04S 7/00 381/119 |
| 2008/0118088 A1 * | 5/2008 | Ketterer | | H04R 5/02 381/119 |
| 2010/0266147 A1 * | 10/2010 | Radford | | H04H 60/04 381/119 |
| 2012/0070004 A1 * | 3/2012 | LaBosco | | H04H 20/30 381/2 |
| 2015/0078584 A1 * | 3/2015 | Moon | | G10H 1/46 381/104 |
| 2015/0125001 A1 * | 5/2015 | Shimizu | | H04R 3/00 381/104 |

* cited by examiner

MODULAR PLATFORM FOR CREATION AND MANIPULATION OF AUDIO AND MUSICAL SIGNALS

CROSS-REFERENCE TO RELATED APPLICATION

This application claims the benefit of U.S. Provisional Patent Application No. 62/144,337, which was filed on Apr. 8, 2015, which is incorporated by reference herein in its entirety.

TECHNICAL FIELD

Teachings relate to audio signal processing and modification. Teachings more particularly relate to construction and user management of audio processing and modification devices and units.

BACKGROUND

In this field, there is a general method of assembling a plurality of audio processing units, wiring connections between them, and manipulating them in a creative way. This occurs often with guitar effects, synthesizers, recording studio equipment, and DJ equipment for music or sound effects. Sample effects include distortions, filters, waveform generators, and other known signal processing functions. In order to achieve these effects, artists and sound technicians often use a large number of effects units.

Current systems for combining effects units are fraught with issues. Issues include electrical problems (e.g., ground loops, signal degradation, noise, limited dynamic range, signal incompatibility), mechanical problems (e.g., odd-sized units, DIY unit mounting, substantial set-up and tear-down time, lost components, transportation, physical abuse), usability problems (e.g., tangles of wires, difficult to reach wires, signal debugging, required floor space, unreliable equipment, tripping hazard), and power distribution problems (e.g., decaying batteries, incompatible AC adapters, "buzzy" power, awkward outlet strips).

For an excellent sampling of prior art systems, visit the website "otherbandsstuff.com." The website chronicles the equipment used by performing visitors of a particular music venue, many of which contain many of the issues discussed above.

DETAILED DESCRIPTION

Teachings herein build upon the concept of the modular synthesizer; add usability, ergonomic features, and manufacturing efficiency; and adapt the modular units to be more generally applicable for recording studio use, for DJ use, and for guitar effects. The present invention includes a module and a backplane assembly. One or more modules or "units" plug into a backplane assembly. One objective of the invention is to provide an efficient, flexible, and orderly packaging of signal processing functions as modules presenting an excellent user experience for the musician.

This is a platform for guitar effects, modular synthesizers, studio equipment, and DJ and electronic dance music setups. The markets share a common situation: many single function audio signal processing devices are connected together and used like building blocks. Each generally has inputs and outputs and needs a small source of power (roughly 0.05 to 2.0 Watts). People like to select them (based on function, features, brand, implementation, quirks, reputation, etc.) and creatively connect them. There has been no other uniform platform on the market before.

Innovative aspects disclosed herein include a number of mechanical, electrical, operational, and interface-based improvements to audio processing units. To improve on the problems facing currently available solutions, embodiments use surface area effectively, sort functional components, standardize shape, standardize power consumption, and reduce wiring requirements.

Another objective of the invention is that the modules be easy, inexpensive, and efficient to manufacture. Another objective of the invention is to minimize the patch cables and connectors on the front panels using simple analog paths and not digital switching, which leaves room for an improved user interface on the front panels.

Figure 1:
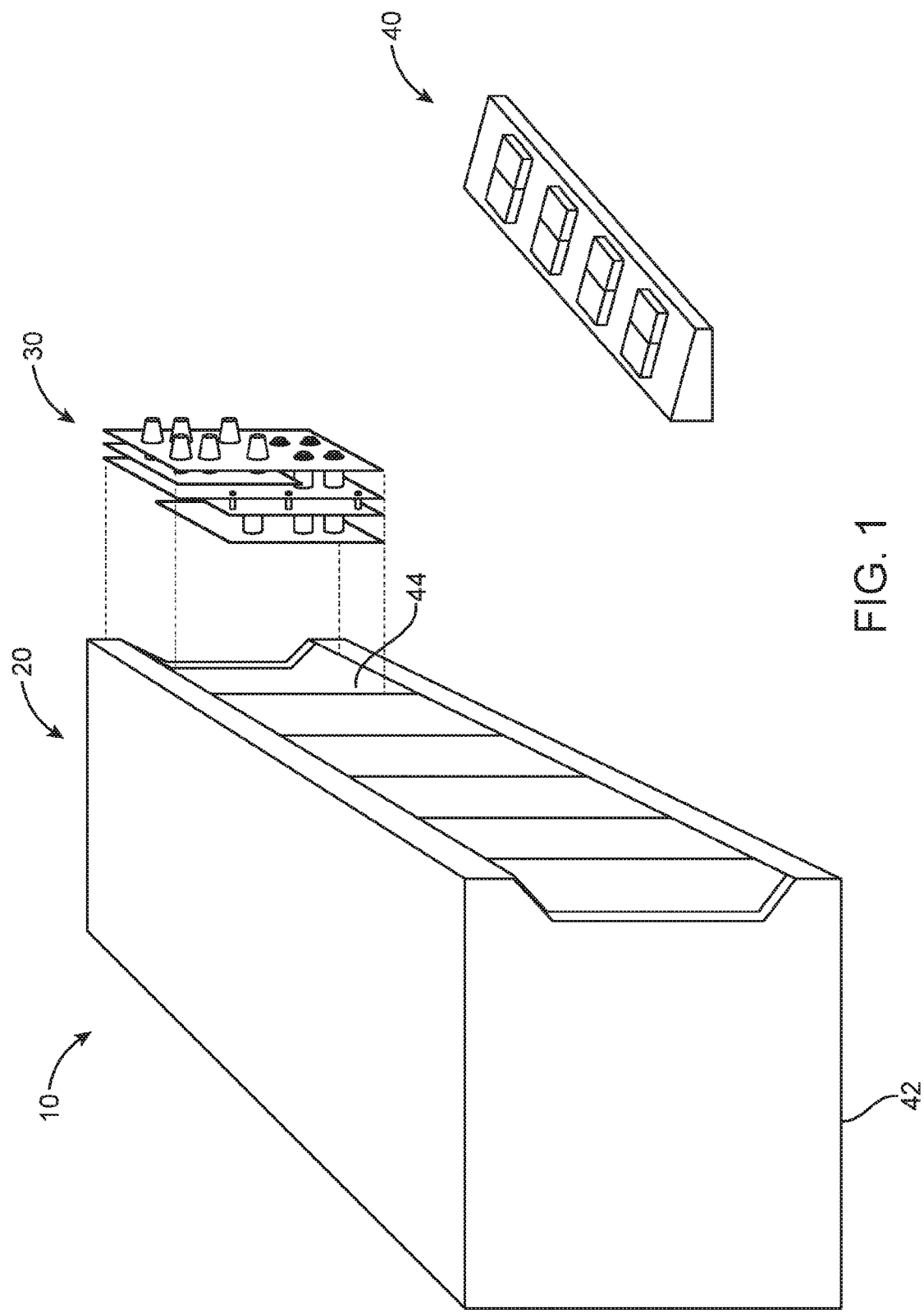
FIG. 1 is an illustration of a modular cabinet with audio processing units and a pedal bar, according to various embodiments.

FIG. 1 is an illustration of a modular cabinet with audio processing units and a pedal bar, according to various embodiments. An audio processing system 10 has three major groups of components. A cabinet 20, a number of audio processing units ("audio units") 30, and peripheral controls 40. The cabinet 20 includes a housing 42 of at least four walls that is open on two sides. In FIG. 1, this is represented as a rectangular prism, though other configurations are possible. Audio units 30 plug into a cabinet 20 in one of a number of bays 44 in one of the open sides, and the audio units 30 are accessible from the rear via the other open side.

Figure 2:
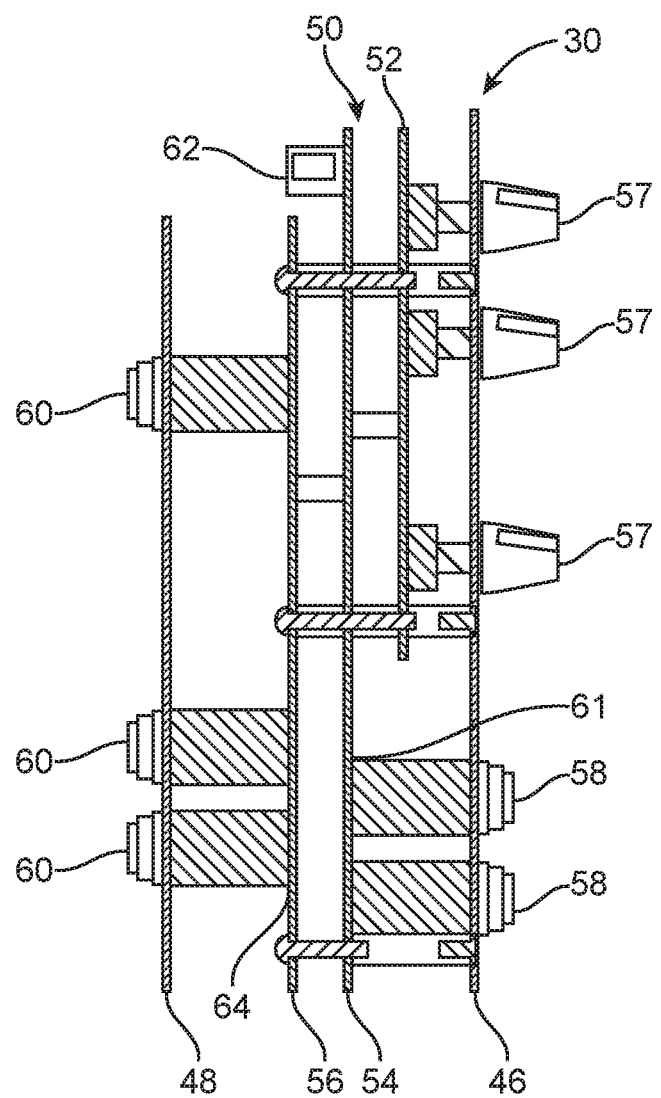
FIG. 2 is a side view of an audio processing unit according to various embodiments.

FIG. 2 is a side view of an audio unit 30 according to various embodiments. Audio units 30 generally include inputs and outputs and cause a hardware-implemented effect to an audio signal. Despite the name "audio processing units" it should be understood that some individual audio units 30 primarily process something other than an audio signal. Some audio units 30 will operate on control voltage signals, the control voltages are used to affect other audio units 30. While a user would not directly hear the processing effect of an audio unit 30 which processed a control voltage signal, these units would control other audio units 30.

The audio units 30 are constructed to a form factor, having a uniform height matching the height of the cabinet 20, a uniform depth matching mounting brackets within the cabinet 20, and a width which is uniform or multiples of a uniform bay width (bays being determined by the spacing between backplane connectors discussed in further detail below).

The audio units 30 include: a front panel 46 including user interface controls and labeling, support input and output; a rear panel 48 including default input and output jacks for the audio unit 30; and a printed circuit board ("PCB") assembly 50. This PCB assembly 50 is comprised of three PCBs: a front PCB 52, a middle PCB 54, and a rear PCB 56. The PCB assembly 50 and the front and rear panels 46, 48 are affixed together.

Traditional audio processing units use only a front panel for all functionality and connections. Here, the front panel 46 is configured as usual, including controls 57 and jacks 58. The rear panel 48 is introduced to offload connectors and wiring from the front panel 46, effectively doubling the panel space and setting aside connections that are rarely used or changed. Front panel space is freed up for significantly improved layout, indicators, labeling, and graphics. The traditional function of a rear panel has been for connections to external devices, away from the user and the front panel.

One type of connector migrated to the rear panel 48 is a "normal" connection. A "Normalled Connector" is an input jack wired so that inserting a plug overrides a default input signal. Normalled connectors were used in the early ARP2600 synthesizer (hardwired and not changeable by the user) and currently are used in studio patch bays to route signals between mixing desks and other equipment. Such connections have not been used in modular unit structures. In some embodiments, for each audio unit 30, each front panel 46 input jack 58 has a default "normal" signal supplied from a signal source plugged into a corresponding rear panel jack 60. The user can wire up their preferred connections in the rear panel 48 and work with only a small number—quite possibly zero—patch cables in the front panel 46.

Methods of use would vary based on for which sort of musical arrangement the audio units 30 are intended. Guitarists tend to run through a single chain of effects, the output of one audio unit 30 feeding the input of the next audio unit 30, using footswitches to enable or bypass the individual audio units 30. On stage, the string of audio units 30 are connected in the rear, and the guitarist would not alter that. At home or in the studio the guitarist may use the front panel 46 to change the order of effects or to bring in external devices.

Synthesizer and studio technicians tend not to use a single chain of effects but instead have a tangled web of connections that they are always changing. Some studio technicians may not use the default connections at all. More likely, the studio technicians would have a default set of connections, of which some would be overridden often, and some rarely. Alternatively, the studio technician may connect a number of audio units 30 into a set in order to perform some function. The set is patched up in the rear panel 48 and considered as a functional block. In use, a user would patch the inputs and outputs of the functional block but leave the connections between the set of audio units 30 unchanged.

A number of examples for rear panel jacks/connectors 60 are provided below. Rear panel "mix" inputs add their signal to the front panel input, extending the number of inputs mixed together. The rear panel 48 includes all front panel 46 outputs using common wiring. This also reduces the need for Y-adapters that would be needed to split an output to multiple inputs. Rear panel "rarely-used-but-nice-to-have-available" inputs and outputs add capabilities without taking up front panel room.

Rear panel 48 additionally may provide for multiple outputs. For the case of an audio unit 30 with multiple outputs, a rotary switch is often the preferred method of selecting between them, but simultaneous access is also beneficial. For this situation, a rotary switch on the front panel 46 and multiple simultaneous outputs on the rear panel provide the best of both worlds. In addition, the selected output of the rotary switch is also available on the rear panel 48.

Circuitry is divided among the components of the PCB assembly 50. In some embodiments, the front PCB 52 includes controls, dials, switches, and LEDs. The middle PCB 54 includes the core electronics providing the audio processing effect for the particular audio unit 30. The middle PCB 54 additionally includes front jack connectors 61 and a backplane connector 62. The backplane connector 62 may include a number of common connections for power, grounds, a monitor BUS, LED dimming, and signals for peripheral controls.

Usually, in other audio units, the backplane has a substantial number of contacts, the backplane connectors are oriented vertically and strung together with parallel horizontal traces on the backplane PC board, which takes up a significant amount of surface area on the rear panel.

Here, some embodiments of the backplane connector 62 have a sufficiently small number of contacts (ex: 12) that do not use much space. In these cases, the backplane connectors 62 may be oriented on the middle PCB 54 horizontally using even less space. So the backplane only takes up 0.75 inches along the top, leaving the rest of the space available for the rear panel 48.

A further innovative aspect is that the backplane connector 62 isn't actually on the "back." The traditional approach is to place the backplane connector 62 on the rear panel 48. However, in doing so, the 12 (or however many are used) pin connections would have to be sent from the rear PCB 56 to the middle PCB 54, where they're actually used and where the majority of the circuitry is located.

So instead, the audio unit's backplane connector 62 is mounted on the middle PCB 54, and a backplane mount in the cabinet 20 is positioned accordingly. And thus, the rear PCB 56 only provides connections 64 to the rear panel jacks 60 and no circuitry or components of any kind.

Figure 3:
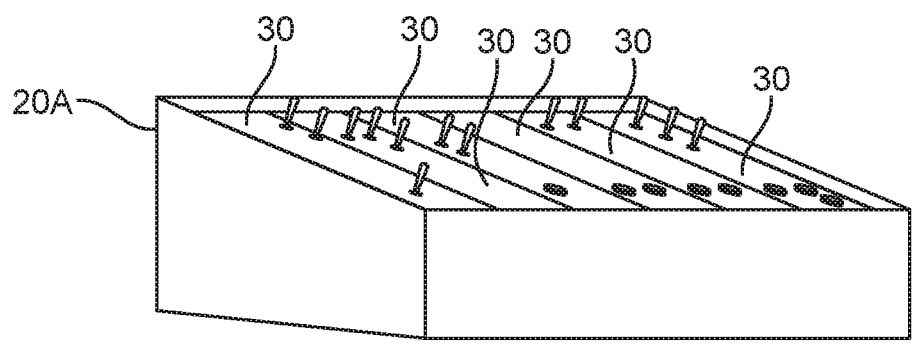
FIG. 3 is an isometric view of a sloped cabinet embodiment.
Figure 4:
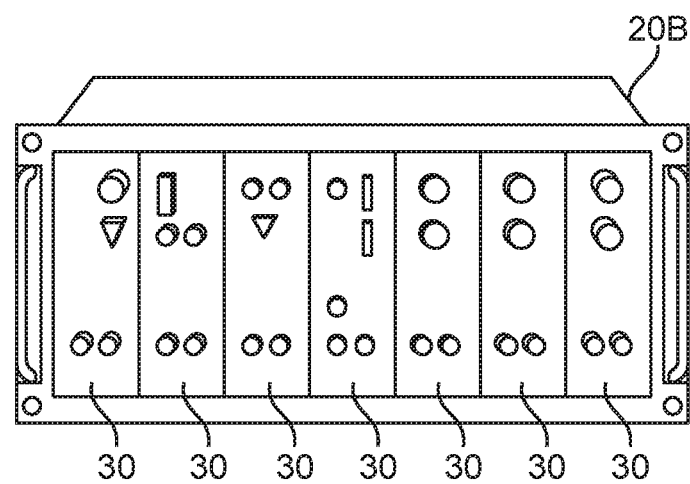
FIG. 4 is a front view of an equipment rack-enabled cabinet according to various embodiments.

FIGS. 3 and 4 are illustrations of alternate cabinet embodiments. One example is a sloped cabinet 20A where the front panel 46 of audio units 30 is angled up, and access to the rear panels 48 is achieved through the back of the cabinet 20A, at the now "bottom" of the audio units 30. Alternate cabinet 20B is designed to mount to a standard 19-inch equipment rack. Alternate cabinet 20B is accessed through the front and back as normal.

The open rear section of cabinets 20 provides easy access to the rear panels 48 of all the audio units 30, with room for patch cables to make connections between them. Optionally, the open rear section may be sealed with a cover to conceal it or for travel. Cabinets 20 can be short, long, plain, fancy, or robust for touring. The form factor can be implemented in a rectangular cabinet (sitting on a table, shelf, or guitar amp), or in a sloped desktop cabinet like a mixing board, or adapted to a 19-inch equipment rack.

Figure 5:
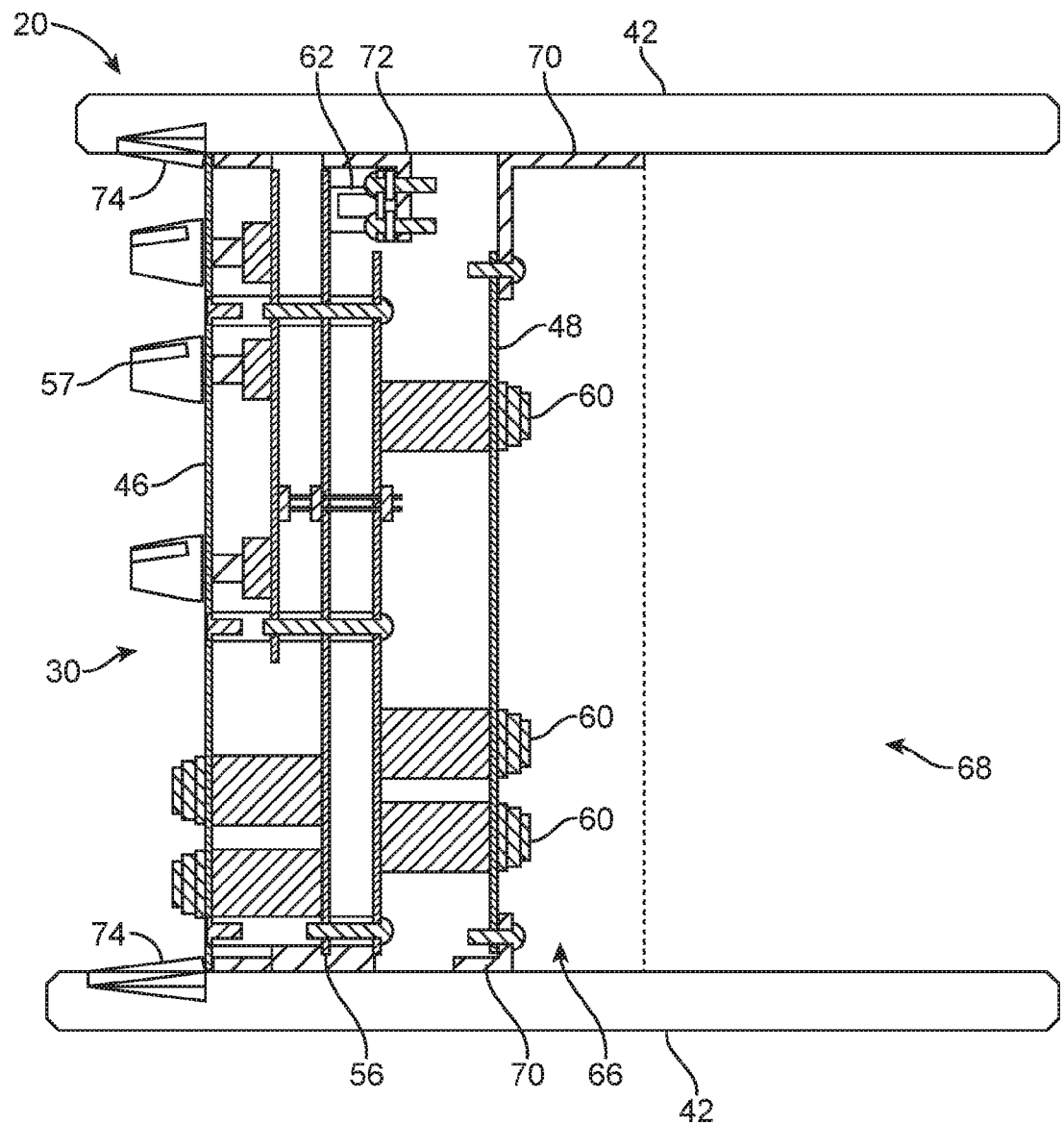
FIG. 5 is a side view of an audio processing unit installed in a cabinet according to various embodiments.

FIG. 5 is a side view of an audio unit 30 installed in a cabinet 20 according to various embodiments. The volume of the cabinet 20 is divided into two regions: the unit volume 66 and the cable volume 68. The unit volume 66 comprises the front region of the inside of the cabinet 20 and houses audio units 30. The cable volume 68 comprises the rear region of the inside of the cabinet 20 and provides space for patch cables (not shown) to connect to rear jacks 60 on the rear panel 48, for the power supply (not shown, numerals provided with reference to FIG. 8), and for any peripheral accessory hookup (not shown, numerals provided with reference to FIG. 9).

The audio units 30 are affixed to the cabinet 20 through brackets 70 that secure (via bolts, screws, or other physical attachment means known in the art) to the audio unit 30, a backplane rail 72 which the backplane connector 62 plugs into, and force fit guides 74 to align the audio units 30 with the backplane rail 72.

The cabinet 20 features a backplane rail 72 in the form of a narrow PC board mounted on an aluminum bracket, with multi-pin female header connectors (ex: 12-pin) spaced at a uniform distance (such as 1.2 inches). The connections are common to all the header connectors. The backplane connector 62 is physically located in a small area at the very top of each audio unit 30 so as not to interfere with access to the rear panel 48. Each audio unit 30 has a male shrouded header connector 62 on the main middle PCB 54 because that is where the backplane signals are needed.

The backplane connection provides:
(1)-(4) Power supply voltages from a regulated power supply (see FIGS. 8 and 9) mounted in the cabinet 20. 2 pins each are used for positive and negative voltage As an example of power supply ranges, +15V and −15V are suitable.
(5)-(8) Three ground connections for best grounding practice: signal ground (uses 2 pins), a "dirty" ground for higher current draws so they don't disturb the signal ground, and a chassis ground for shielding.
(9)-(10) "Solo Tap Bus" signals, which are two connections (i.e., "solo tap enable," "solo tap audio") common to all audio units 30.
(11) An LED Brightness signal, which is used to dim all the module LEDs at once. The individual audio units 30 would have to support this signal.
(12) A spare signal, which is user assignable (e.g., for peripheral controls).

The "Solo Tap Bus" enables many audio units 30 to have a Solo Tap Switch that places the output signal of that audio unit 30 on the backplane's Solo Tap Bus for the purpose of monitoring that signal in headphones without disturbing the main output. This is a feature found in some studio mixers for listening to an individual input in a mix. This enables a taping off function to take the signal at various points in a chain of audio units 30 to debug a patch, for tuning, or other adjustments.

Audio vs. Control: The system 10 draws a distinction between signals that are intended to be used for audio and signals that are intended to be used to control parameters. This is not to restrict their use but to provide optimized features and signal paths. Audio signals are referenced at 0 dBu to be compatible with studio equipment; control voltages are referenced to 1.0V to be compatible with synthesizers; input signal presence detectors are specialized for audio and control voltages (see below); audio input level controls are calibrated in dB, with 0 dB unity gain at 12 o'clock; control voltage input level controls are calibrated in percent with reference sensitivity at full clockwise rotation; audio signal paths are optimized for low noise and graceful overload; control voltage signal paths are optimized for precision and low offset.

Figures 6A, 6B:
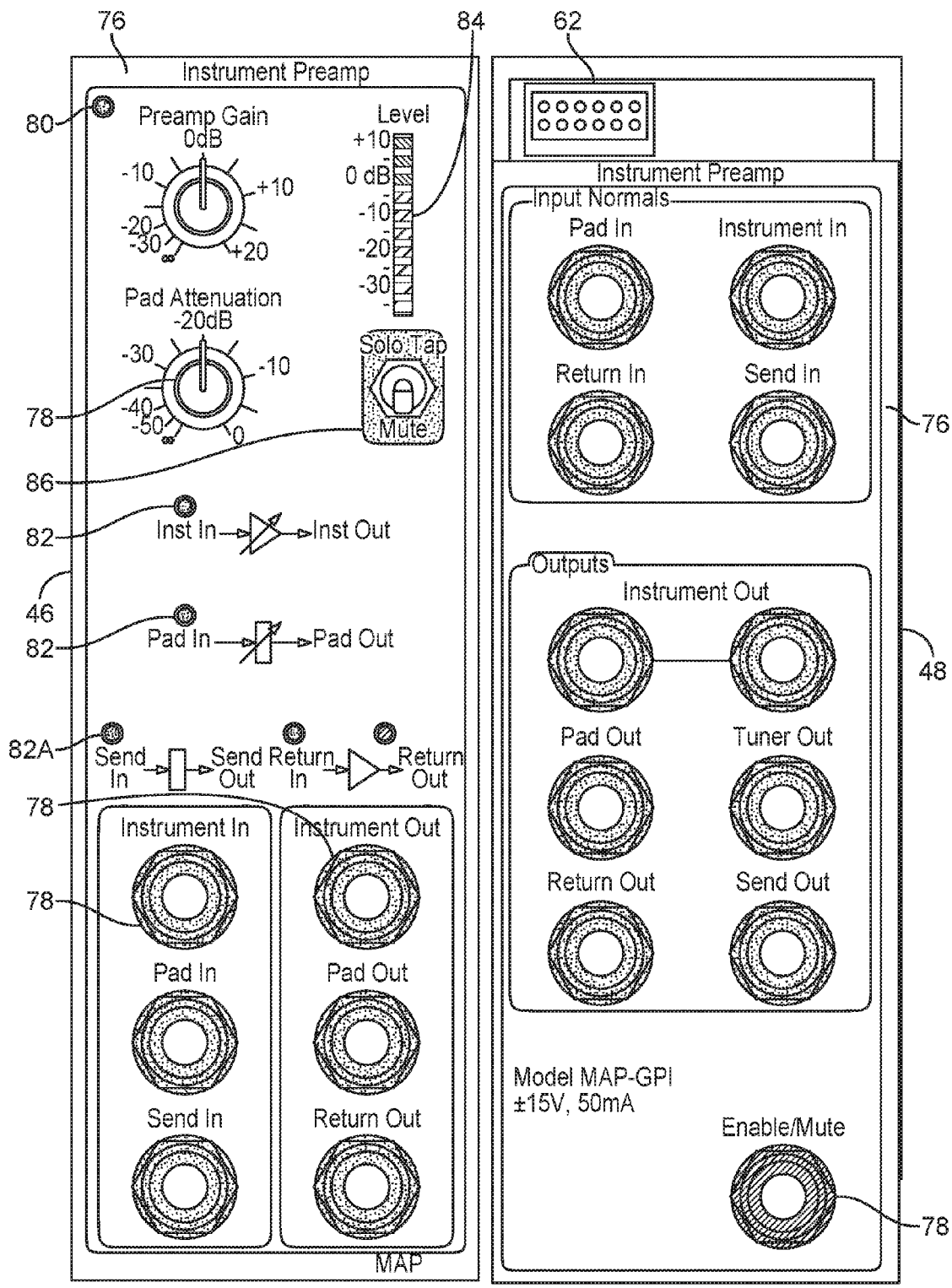
FIG. 6A is an illustration of a representative front panel of an audio processing unit.
FIG. 6B is rear view illustration of an audio processing unit.

FIGS. 6A and 6B are illustrations of a representative front panel 46 of an audio unit 30. The front panel 46 and rear panel 48 use color schemes to provide visual clues of operation. Operation is designated by color with both a panel border 76 and with objects 78.

In some embodiments, a ROY-G-BIV scheme is used wherein the red side of the rainbow represents low frequencies, and the violet side represents high frequencies. For objects 78 such as input jacks, output jacks, knobs, and panel graphics, red corresponds to low frequency or DC voltages that control parameters; blue corresponds to audio frequency signals; and white corresponds to parameters.

Similarly an audio unit's 30 function is represented through a color scheme marked around the panel border 76 and on a pilot light LED 80. A pilot light LED 80 glowing the color scheme enables users to find the audio unit 30 on dark stages. In some embodiments, a ROYGBIV color scheme is used such that a rough approximation of a module's function is clear at a quick glance. As an illustrative example, the front and rear panels 46, 48 use colors like:
Red: control and pitch voltages
Orange: low frequency modulation sources
Yellow: functions that filter down audio
Green: audio gain and mixing
Blue: audio sources, oscillators
Violet: functions that create harmonic content The pilot light LED 80 is driven by a circuit requiring similar or identical power requirements as the rest of the audio unit 30 (e.g., at least 28V between the +15V and −15V supply voltages) in order to turn on, so an unlit pilot light LED 80 suggests power supply problems.

The front panel 46 further includes signal presence detector LEDs 82 on audio inputs. The signal presence detector LEDs 82 flash when the signal level is above −20 dBu regardless of the setting of an input level control, so users can see if a signal is present at an input before it is used. This enables a user to watch a signal propagate through a chain of modules and instantly see where the signal drops off.

Studio or stage mixers often in practice mix about 8 to 40 parallel inputs (drum mics, vocal mics, keys, bass, etc.) into a stereo pair using one operation. In order to isolate a single instrument or track, mixers have a "solo switch" that enables a single input channel in isolation.

As a result that audio units 30 are chained together, the Solo Tap switch is functionally similar to a mixer, but instead listening to 1 of N parallel inputs in isolation, an output signal is generated at various points along a chain of effects (or in any other configuration of linked effects where audio units 30 are patched together) to see how the signal changes and progresses along the way to find out investigate signal attributes at various points in an effect. Where the output signal exists is indicated by the signal presence LED 82.

In some embodiments, the front panel 46 includes Control Voltage Signal Presence Detector LEDs ("CV-LED") 82A. A CV-LED 82A is a two-color LED indicator that linearly glows one color for the greatest positive control voltage, to off for zero voltage, to a second color for the greatest negative control voltage. Thus the glow of the LED can display an approximate indication of DC voltage level, AC voltage level, frequency, waveform, or overall trends. The CV-LED 82A is a "one bit oscilloscope" that describes the signal before it is used. For example, if the signal was a square wave, the CV-LED 82A would alternate between two colors instantly, if the signal were a sawtooth wave, the CV-LED 82A would instantly change between colors and then gradually build back to the first color, and for a triangle wave, the CV_LED 82*a* would gradually shift between the two colors.

At 0V the CV-LED 82A is off. At peak positive voltage the CV-LED 82A glows at maximum brightness of the first color. At peak negative voltage the CV-LED 82A glows at maximum brightness of the second color. At any intermediate voltage, the CV-LED 82A glows at less than maximum brightness of either the color associated with the corresponding polarity. If the frequency of the signal wave was too high for a human to discern, then the CV-LED 82A glows both colors simultaneously, thereby generating a third color.

The front panel 46 of some audio units 30 also includes LEDs and bar graph 84 displays which present the major parameter or the dynamic state of the audio unit 30. The major parameter, such as the tuned frequency of a filter, may be controlled by a combination of various knob settings and control voltage inputs, and a bar graph 84 can display this very well. In some embodiments, bar graphs 84 that represent frequency or pitch are horizontal and are calibrated to one dot per octave, whereas bar graphs 84 that represent signals or voltage levels are vertical.

LED drive circuitry uses constant current sources, set by the LED Brightness signal from the backplane connector 62, and those currents are steered either through or around the LED. LEDs switching on and off will not disturb the signal ground.

The layout of the front panel 46 is also consistent. Inputs are located on the lower left, input levels are above the inputs, outputs are on the lower right, parameter knobs are on top, and graphic diagrams are near the center top. Solo Tap/Bypass switches are center far right.

The front panel 46 includes a number of graphics to aid usability. Examples of such graphics include:
(1) Printed text on the module is near black-on-white (charcoal-on-ivory) for maximum readability.
(2) Outputs are differentiated from inputs with white-on-black printing.
(3) A frame is printed around the perimeter of the module in the module color to both identify the function of the module and make its boundaries clear.
(4) Rounded rectangles group related controls and switches.
(5) Each module includes a block diagram representation of the function and signal flow of the module, including all inputs and outputs.

The rear panel 48 may also include graphics. Example schemes are similar and adapted for a panel including only jacks. Consistent layout (tabbed categories, inputs on top, outputs below), charcoal-on-ivory, white-on-black outputs, and colored frames are examples.

Many audio units 30 have either a "Disable" operation to turn the module off or a "Bypass" operation to take that audio unit 30 out of the circuit, jumping the inputs to the outputs (e.g., an audio source can be disabled, a filter or other signal processor could be bypassed). The bypass can be performed by a front panel 46 switch, or by a rear panel 48 jack that can accept either a control voltage (ex: +1.0V for enable, 0V for disable or bypass) or a shorting footswitch. This is useful for performance as well as debugging.

In some embodiments, audio units 30 have a single three-position switch 86 for the Solo Tap operation and the disable (or bypass) operations. Examples of switch position functions include: up: "Solo Tap", center: "Normal (enabled)", down: "bypassed" or "disabled".

Figure 7:
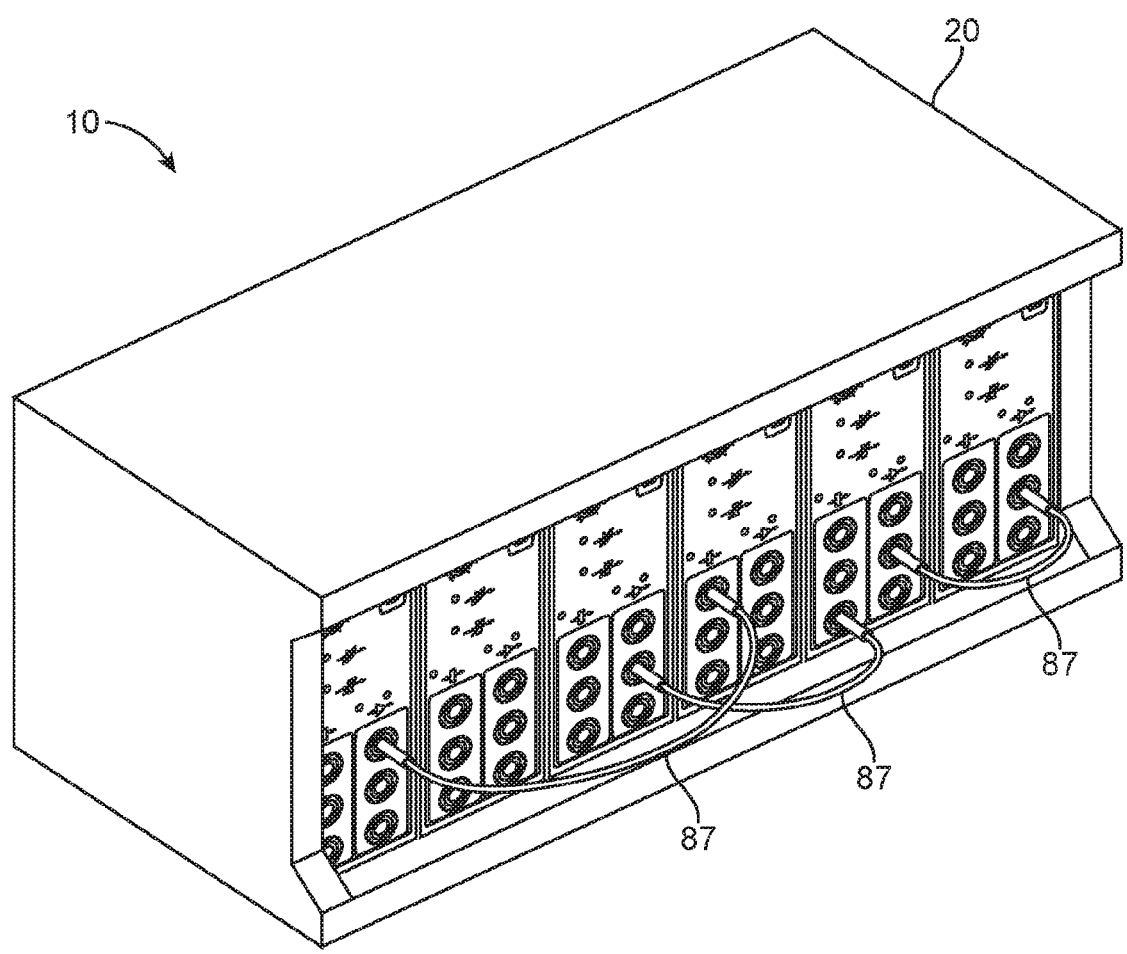
FIG. 7 is a front, isometric view of a cabinet loaded with audio processing units which are wired for use, according to various embodiments.

FIG. 7 is a front, isometric view of a cabinet 20 loaded with audio units 30 which are wired for use, according to various embodiments. From the front, when used with an electric instrument, it is unlikely to see many patch cables 87 connecting the audio units. This is because most connections would be made via the rear. In operation, set-up would take mere seconds of locating a place to set the cabinet 20.

In some embodiments, audio units 30 are built for efficient manufacturing. The units 30 are constructed like a sandwich of three PC boards, with header connectors making electrical connections between them, between two panels. The PC boards are mostly built by pick-and-place machines. The layers are, front to back: (1) front aluminum panel, (2) front PC board (pots, switches, LEDs), (3) main PC board (main circuitry, front jacks, backplane connector), (4) rear PC board (rear jacks), and (5) rear aluminum panel. Boards screw together with header connectors making electrical connections between them. No hand soldering of wires is required.

The audio units 30 have a common height (e.g., 7 inches) and depth (e.g., 2.5 inches panel-to-panel). The width can be a multiple of 1.2 inches (i.e., a module is typically 2.4 or 3.6 inches wide). Guitar use often includes a preamp unit that brings the high impedance, low voltage guitar signal up to a 0 dBu studio standard level. After that, all studio, DJ, and synth modules can be used with guitars, as well as any external studio equipment. Guitarists can even build their own effects from functional blocks.

Most units can be controlled by changing parameters with a control voltage, or enabling, disabling, or bypassing with a voltage or shorting connection. And so the modules can all be remote controlled by footswitches and foot pedals, either connected individually, or together through a multi-conductor cable, or through a module with a Bluetooth connection. A single pedal can control multiple modules.

Figure 8:
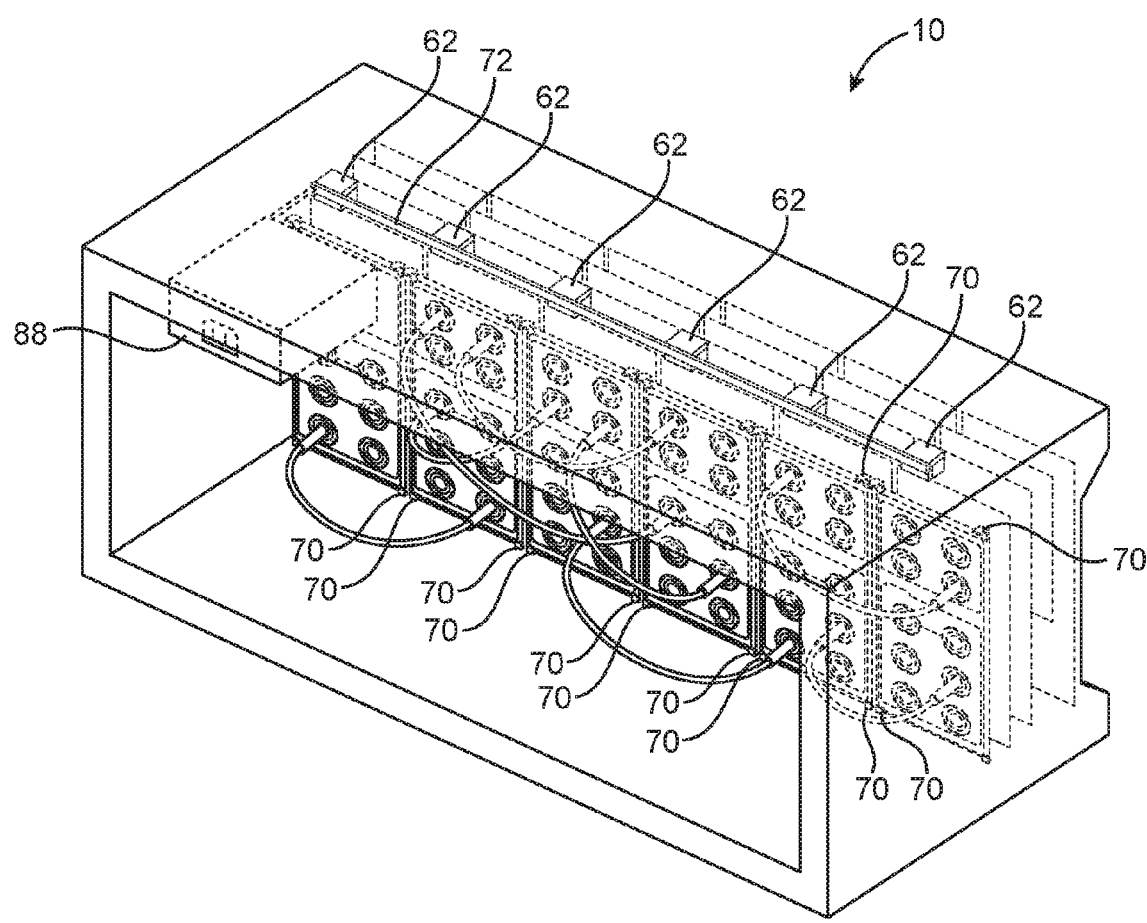
FIG. 8 is a rear, isometric, x-ray view of a cabinet loaded with audio processing units which are wired for use, according to various embodiments.

FIG. 8 is a rear, isometric, x-ray view of a cabinet loaded with audio processing units which are wired for use, according to various embodiments. This angle shows an alternate point of view from FIG. 5. Displayed is the power supply 88, which is located in the cable volume 68 and mounted to the housing 42 of the cabinet 20. The power supply 88 includes an outlet in order to plug in a power cable to draw power from an external source (e.g., wall outlet). The power supply 88 is further electrically connected to the backplane rail 72. Further shown are brackets 70 for mounting audio units 30 to the cabinet 20, and a number of backplane connectors 62 each associated with an audio unit 30 plugged into the backplane rail 72. Many audio units 30 are connected via patch cables 87 in a "default" configuration.

Figure 9:
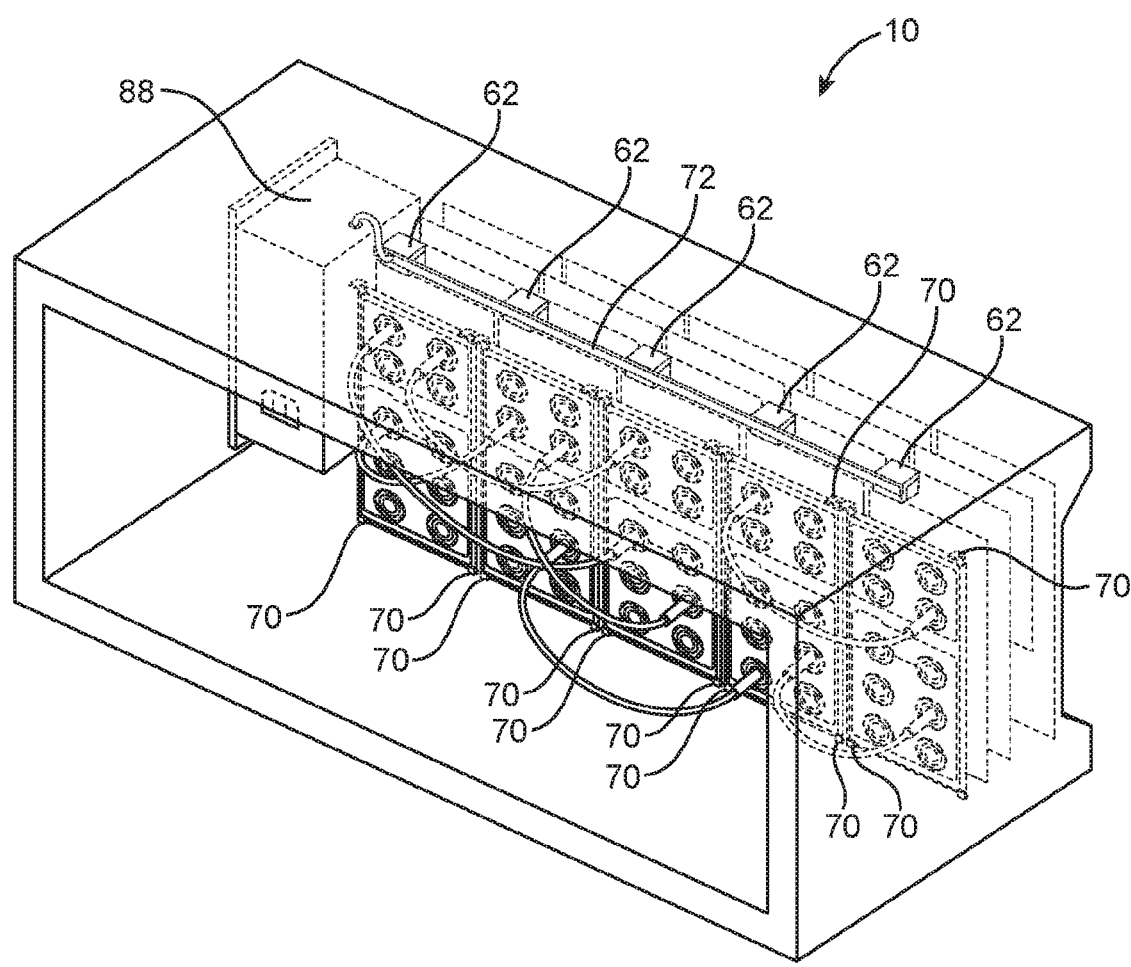
FIG. 9 is a rear, isometric, x-ray view of a cabinet including a power supply module occupying a unit bay, according to various embodiments.

FIG. 9 is a rear, isometric, x-ray view of a cabinet including a power supply module occupying a unit bay, according to various embodiments. In some embodiments, the power supply 88 is slim profile and fits above jacks and labeling on the rear panel of the adjacent audio unit 30. In other embodiments, the power supply 88 takes up an entire bay 44 in the cabinet 20, so as to not interfere with visual and cable accessibility to any given audio unit 30.

Figure 10:
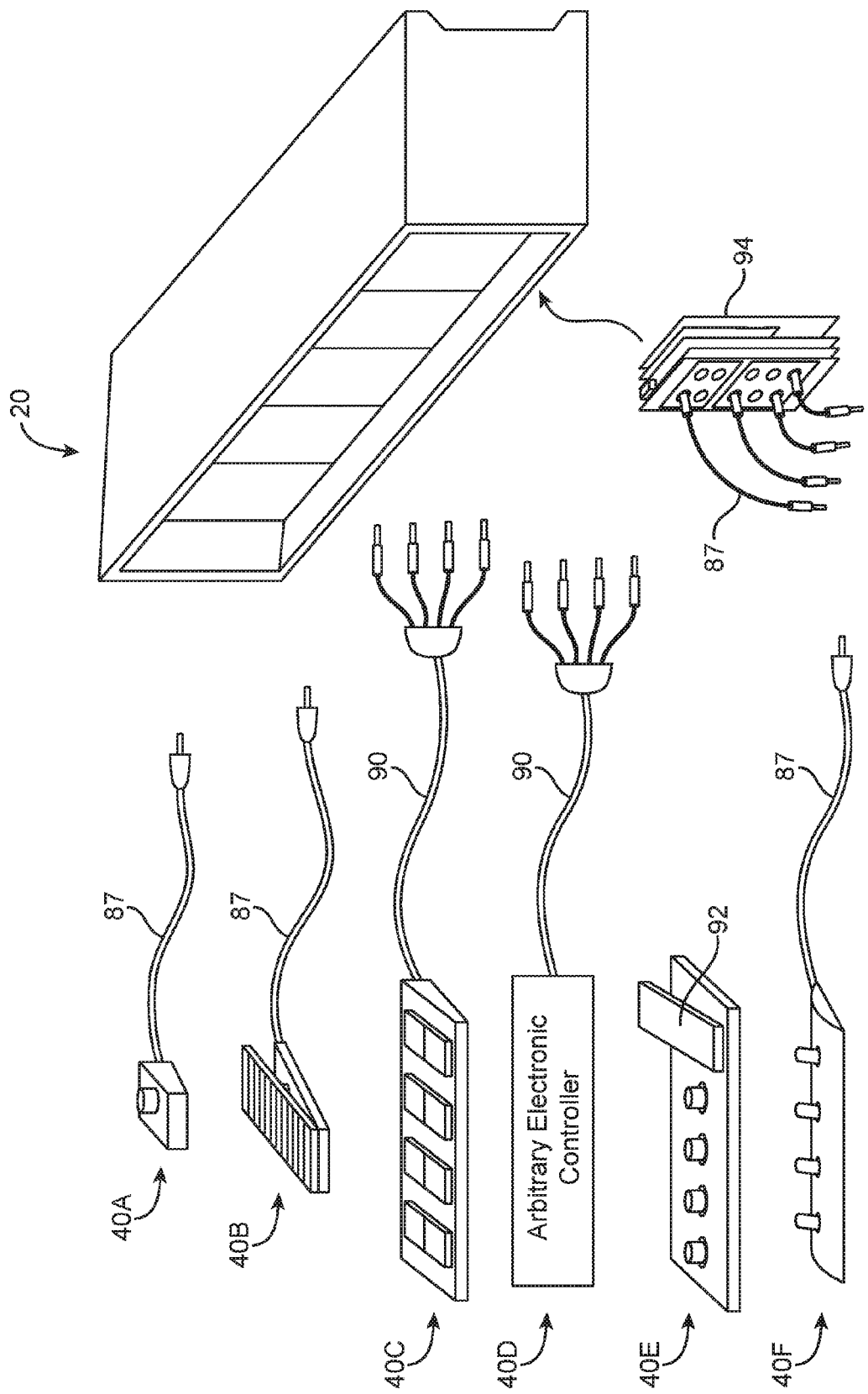
FIG. 10 is an illustration of a number of embodiments of pedal apparatus and connection mechanism.

FIG. 10 is an illustration of a number of embodiments of pedal apparatus and connection mechanisms. Users of the audio processing system 10 may want to control effects with their feet. Electric guitar players are a good example; they use a lot of effects, and both hands are required to play the instrument, so typically the effects come from little boxes sitting on the floor; each box has a push-on/push-off switch on the top to enable or bypass the effect, the boxes are connected together in a chain with patch cables 87, and the whole mess is wired between the electric guitar and the amplifier.

In practice, right before taking a solo, the guitarist points a foot and taps the switch on the box, which gives the louder soloing sound, and taps again when finished with the solo. The foot pointing process the musician takes is effective, but the mess on the floor, the electronic problems, the power problems, the space on the stage, and so forth are cause both logistic and quality concerns.

The audio processing system 10 delivers effects through audio units 30, mounted in a cabinet 20, with a backplane rail 72 supplying power and some other functions, and the cabinet 20 is off the floor, perhaps to one side, perhaps on top of a nearby speaker cabinet or amplifier. Accordingly musicians may still want foot control over some number of the audio units 30 placed in the cabinet 20.

Each applicable audio unit 30 has an input jack on the rear panel 48 specifically for enabling or bypassing the effect. Electrically this can be achieved with either a control voltage (0V for bypass, 5V for enable) or by shorting the connection to ground with a switch (e.g., short for bypass, open for enable, thus enabled by default, which is useful). In this way, any number of modules can activate or bypass any number of footswitches by cabling the footswitches through the rear of the cabinet 20 to the enable/bypass jacks on the rear panels 48 of the intended modules.

A number of embodiments of peripheral controls 40A-F with a number of footswitches in a common narrow strip are shown. Peripheral switch 40A is a single switch that may be stomped with a patch cable 87 for connecting directly to a particular audio unit 30. Peripheral pedal 40B is similar to switch 40A, but rather than having a binary input, it has a pedal range of motion which is useful for applications of a "wah-wah" pedal effect, a volume pedal, or a variable speed control.

Pedal bar 40C displays a number of switches or pedals connected to a multi jack 90 which carries multiple signals, but only has a single cable trailing from the floor while connecting to a number of audio units 30. The multi jack 90 may make use of a color scheme to match a given jack to a given pedal on the pedal bar 40C. In addition to a pedal bar 40C, a number of other types of controls peripheral controls may be inserted to a control bar 40D. other examples of controls include a dial, foot levers, or sliders. These controls may either have a binary output, or a number of outputs as depending on a range of motion.

A wireless control bar 40E functions with a wireless transceiver 92 and a cable module 94. The cable module 94 plugs into a cabinet bay 44 much in the same manner an audio unit 30 is inserted into the cabinet 20. Here the wireless control bar 40E communicates with the cable module 94 using wireless communication protocols to deliver signals to output jacks which connect to audio units through patch cables 87. Examples of suitable wireless communication protocols include paired Bluetooth, unpaired Bluetooth low energy, RF, Wi-Fi, or other suitable wireless communication known in the art. The use of a wireless module 94 enables default connections to be wired up further reducing setup time.

Alternatively to a wireless single jack, multi-function bar 40F provides all the functionality of the pedal bar 40C, with only a single patch cable 87. The patch cable 87 connects to a cable module 94 directly. Alternatively, the cable module 94 may be built into the power supply 88 wherein signals are delivered to individual audio units 30 via the backplane rail 72 and backplane connectors 62. In use, the peripheral controls 40 are communicatively coupled to the backplane rail 72. The peripheral control configuration is effective for users who are wary of wireless connections but still want to minimize setup time. Guitarists are the extreme example, other applications will find this remote pedal operations useful too.

Modular synthesizers (Moog, Buchla, et al) introduced the concept of a platform-based system where the functional units are delivered as "modules" in a common form factor, with controls, switches, and jacks on the front panels. The modules mount in a row in a cabinet, bolts securing the front panels, and with a common power supply connected through cabling in the rear. Connections between the modules are made with patch cables plugged into the jacks on the front panel. The modular synthesizer addressed some of those difficulties in a limited application. One of the problems with modular synthesizers is that front panel space is heavily compromised between the needs of switches, knobs, jacks, functionality, indicators, layout for clear signal flow, graphical presentation, usability, and the need for compact physical space.

Another of the problems with the modular synthesizer is the profusion of patch cables covering the front of the unit making operation difficult. The 2600 synthesizer made by ARP Instruments addressed this by what are termed "normalized connections". The 2600 was a single unit with hard wired connections behind the front panel to the shorting terminals of the input jacks, and this provided a useful default connection; patch cables would override that default.

Another objective of the invention is to provide the normalized connections feature of the ARP 2600 as user settable instead of hard wired, and across multiple modules. Another objective of the invention is that the modules can be easily reorganized, snapping in and out of the backplane assembly, but can also be tightly secured for a more permanent setup or for transportation. Another objective of the invention is to provide multiple packaging options. Another objective of the invention is to address hum, noise, and ground loop problems by keeping signal ground, high current ground, and chassis ground separate. Another objective of the invention is to significantly reduce the time and effort in diagnosing and correcting unintended operation (connections, knob settings, signals, etc.), even in a chaotic stage performance environment. Another objective of the invention is to provide a mechanism to quickly tap into the signal at various points for tuning and debugging purposes without affecting the main output that the audience hears.

Another object of the invention is to provide an adjustable display brightness consistent across all modules. Another objective of the invention, for use as guitar effects, is to provide a preamp stage to address signal degradation and bring the guitar signal level up to 0 dBu studio standard for compatibility with the other equipment. Another objective of the invention, for use as guitar effects, is to have a remote footswitch so the main electronic functions do not have to be placed on the floor, and for pedals to control arbitrary functions remotely. The invention comprises the construction and specific features of the modules and the backplane assembly that the modules plug into. The signal processing functions of the modules themselves could take many forms and are not covered by this invention.

The cabinet housing the backplane assembly could also take many forms and is not covered by this invention. Examples include a rectangular cabinet with the modules facing forward for placement on a shelf or speaker cabinet, wedge shaped with the modules faced angled up for placement on a desk top, or mounted in a standard 19-inch equipment rack.

The module is a stack of front panel, the front printed circuit board, the main printed circuit board, the rear printed circuit board, and the rear panel 8. Machine screws and sleeves secure the printed circuit boards to the front panel. Stacking connector provides electrical connections between the printed circuit boards. Connector provides electrical connections from the module to the backplane for power, grounds, and other signals. The front panel is presented to the user and is used to mechanically mount switches, jacks, and light pipes for the LEDs. The front printed circuit board, provides the electrical connection to the front panel controls, switches, and displays, and provides the circuitry associated with these. The main printed circuit board 6 contains the core circuitry for the module, the backplane connector 9, and the connections to the front panel audio connectors. The rear printed circuit board provides the electrical connection to the rear audio connectors, mounted on the rear panel. The rear panel is used to mechanically mount the rear panel jacks. The rear panel jacks can be used to provide "normal" signals for the front panel jacks, to provide "mix" signal that extend the number of inputs, to provide alternate or rarely used inputs, to provide copies of the front panel outputs to be used for default patch wiring, to provide alternate or rarely used outputs, to provide multiple simultaneous outputs when switched output signals make a better user interface on the front panel, to provide access to internal signals for expansion, to provide inputs and outputs to devices outside the enclosure, and provide an enable/bypass input function. Thus the rear panel serves to move most cables off of the front panel area.

The backplane assembly includes the backplane with regularly spaced connectors 19 mounted on an L-shaped support. A second L-shaped support is at the bottom. The module slides in with guide flaps that hold a row of modules in position. Alternatively, modules can be permanently secured in place with screws through the L-shaped supports. The backplane provides common electrical connections between the modules, and includes connections for three separate grounds (signal ground for audio signals, "dirty" ground for high current returns, and a chassis ground for shielding and chassis connections), power supply (+I−15.0 VDC regulated), a monitor BUS to tap a signal off of any module, and a display LED brightness signal to adjust the brightness of all the LED's on all the modules together.

FIG. 1 includes a footswitch assembly 3. This is an optional device for controlling any number of modules. It connects either by cable or by Bluetooth to a footswitch controller module. Each cabinet also includes a power supply unit to provide +I−15.0 V for the modules.

The invention claimed is:

1. An audio processing system, comprising:
an audio processing unit including:
   a rear panel including a first set of input and output jacks for the audio processing unit;
   a front panel including user interface controls and labeling, a second set of input and output jacks, and display components;
   a printed circuit board assembly (PCB) positioned between the front panel and rear panel electrically connected to components of the rear panel and components of the front panel and including a backplane connector, and includes a circuit configured to process audio signals or control voltages received from the first and second sets of input jacks, and deliver processed audio signals to the first and second sets of output jacks; and
a cabinet including:
   a cabinet housing having a front opening, a rear opening, a unit volume, and a cabling volume, wherein the unit volume is adjacent to the front opening, the cabling volume is adjacent to the rear opening, and the unit volume and the cabling volume are adjacent to one another and the volumes are defined inside the cabinet housing by a plurality of mounting flanges;
   a backplane rail mounted inside the cabinet housing and inside the unit volume having a plurality of backplane connectors spaced uniformly across the backplane rail, wherein each audio processing unit is plugged into a backplane connector;
   cabling providing electronic signal interconnection between the audio processing units, wherein the cabling is contained within the cabling volume and adjustable through the rear opening of the cabinet housing;
   a power supply mounted within the cabinet housing which includes an electric power connection to the audio processing units inside the cabinet and receives a power cable from the exterior of the cabinet thereby providing power to the audio processing units inside the cabinet housing; and
   wherein two or more audio processing units, are contained within the unit volume and the distance between the front panel and rear panel corresponds to the distance between the front opening and the cabling volume of the cabinet housing, and the audio processing units are secured to the mounting flanges.

2. The audio processing system of claim 1, wherein at least one of the first set of output jacks on the rear panel are electrically connected to at least one corresponding number of output jacks on the front panel of the second set of output jacks.

3. The audio processing system of claim 1, wherein the user interface controls and labeling of the front panel include:
   a rotary switch that selects between multiple simultaneous outputs on the rear panel.

4. The audio processing system of claim 1, wherein the rear panel further comprises:
   threaded mounting screw holes.

5. The audio processing system of claim 1, wherein the backplane connector includes:
   power;
   grounds; and
   monitor BUS.

6. The audio processing system of claim 1, wherein the user interface controls and labeling of the front panel further comprises:
   a color coding scheme applied where each of a number of functional groups are provided unique color, the functional groups including:
   control and pitch voltages;
   low frequency modulation sources;
   audio filter down functions;
   audio gain and mixing functions;
   audio sources and oscillators; and
   harmonic content functions.

7. The audio processing system of claim 6, wherein the front panel further comprises:
   A pilot light which activates when the audio processing unit is powered and glows the color corresponding with the functional group of the audio processing unit.

8. The audio processing system of claim 6, wherein the user interface controls and labeling further comprises:
   printed text is black-on-white;
   outputs are differentiated from inputs with white-on-black printing;

a frame is printed around a perimeter of the front panel in the color corresponding with the functional group of the audio processing unit;
rounded rectangles printed around related user interface controls; and
a block diagram representation of the function and signal flow of the audio processing unit, including all inputs and outputs.

9. The audio processing system of claim 1, further comprising:
A bypass circuit configured to bypass the circuit of the PCB, and thereby enable audio signals or control voltages to pass through the audio processing unit unaltered, wherein the bypass circuit is triggered through any of a physical switch on the front panel, the receipt of a predetermined control voltage through a predetermined input jack, or through an electrical signal received through the backplane connector.

10. The audio processing system of claim 1, wherein the display components of the front panel comprise:
an LED oscilloscope that fluctuates between two colors based on a received control voltage, wherein the LED oscilloscope glows a first color at positive voltages and a second color at negative voltages, and the degree of brightness of the LED oscilloscope is controlled by the magnitude of the control voltage.

11. An audio processing system, comprising:
an audio processing unit including:
a rear panel including rear panel jacks, wherein rear panel jacks include default input and output jacks for the audio processing unit;
a front panel including user interface controls and labeling, display components, and front panel jacks, wherein front panel jacks include support input and output jacks, and;
at least three printed circuit boards (PCB) layered between the front panel and the rear panel including a first PCB, a second PCB, and a third PCB wherein,
the first PCB is positioned between and electrically connected to the front panel and the second PCB, and further including a first circuit providing circuitry for the user interface controls and display components of the front panel;
the second PCB is positioned between and electrically connected to the first PCB and the second PCB, and further including a backplane connector, connectors for the front panel jacks, and a second circuit configured to process audio signals or control voltages received from the default, support input jacks, and deliver processed audio signals to the default, support output jacks
the third PCB is positioned between and electrically connected to the second PCB and the rear panel and further including connectors for the rear panel jacks; and
a cabinet including:
a cabinet housing having a front opening, a rear opening, a unit volume, and a cabling volume, wherein the unit volume is adjacent to the front opening, the cabling volume is adjacent to the rear opening, and the unit volume and the cabling volume are adjacent to one another and the volumes are defined inside the cabinet housing by a plurality of mounting flanges;
a backplane rail mounted inside the cabinet housing and inside the unit volume having a plurality of backplane connectors spaced uniformly across the backplane rail, wherein each audio processing unit is plugged into a backplane connector;
cabling providing electronic signal interconnection between the audio processing units, wherein the cabling is contained within the cabling volume and adjustable through the rear opening of the cabinet housing;
a power supply mounted within the cabinet housing which includes an electric power connection to the audio processing units inside the cabinet and receives a power cable from the exterior of the cabinet thereby providing power to the audio processing units inside the cabinet housing; and
wherein two or more audio processing units, are contained within the unit volume and the distance between the front panel and rear panel corresponds to the distance between the front opening and the cabling volume of the cabinet housing, and the audio processing units are secured to the mounting flanges.

12. The audio processing system of claim 11, wherein at least one of the default output jacks on the rear panel are electrically connected to at least one corresponding support output jack on the front panel.

13. The audio processing system of claim 11, wherein the user interface controls and labeling of the front panel include:
a rotary switch that selects between multiple simultaneous outputs on the rear panel.

14. The audio processing system of claim 11, wherein the rear panel further comprises:
threaded mounting screw holes.

15. The audio processing system of claim 11, wherein the backplane connector includes:
power;
grounds;
LED brightness; and
monitor BUS.

16. The audio processing system of claim 11, wherein the display components of the front panel comprise:
an LED oscilloscope that fluctuates between two colors based on a received control voltage, wherein the LED oscilloscope glows a first color at positive voltages and a second color at negative voltages, and the degree of brightness of the LED oscilloscope is controlled by the magnitude of the control voltage.

17. An audio processing system, comprising:
an audio processing unit including:
a rear panel including rear panel jacks, wherein rear panel jacks includes for wiring a number of audio processing units together to generate a functional block ("functional block jacks");
a front panel including user interface controls and labeling, display components, and front panel jacks, wherein front panel jacks include default input and output jacks, and;
at least three printed circuit boards (PCB) layered between the front panel and the rear panel including a first PCB, a second PCB, and a third PCB wherein,
the first PCB is positioned between and electrically connected to the front panel and the second PCB, and further including a first circuit providing circuitry for the user interface controls and display components of the front panel;
the second PCB is positioned between and electrically connected to the first PCB and the second PCB, and further including a backplane connector, connectors for the front panel jacks, and a second circuit configured to process audio signals received from the functional block jacks, default input jacks, and deliver processed audio signals to the output jacks; and the third PCB is positioned between and electrically connected to the second PCB and the rear panel and further including connectors for the rear panel functional block jacks; and a cabinet including:
 a cabinet housing having a front opening, a rear opening, a unit volume, and a cabling volume, wherein the unit volume is adjacent to the front opening, the cabling volume is adjacent to the rear opening, and the unit volume and the cabling volume are adjacent to one another and the volumes are defined inside the cabinet housing by a plurality of mounting flanges;
 a backplane rail mounted inside the cabinet housing and inside the unit volume having a plurality of backplane connectors spaced uniformly across the backplane rail, wherein each audio processing unit is plugged into a backplane connector;
 cabling providing electronic signal interconnection between the audio processing units, wherein the cabling is contained within the cabling volume and adjustable through the rear opening of the cabinet housing;
 a power supply mounted within the cabinet housing which includes an electric power connection to the audio processing units inside the cabinet and receives a power cable from the exterior of the cabinet thereby providing power to the audio processing units inside the cabinet housing; and
 wherein two or more audio processing units, are contained within the unit volume and the distance between the front panel and rear panel corresponds to the distance between the front opening and the cabling volume of the cabinet housing, and the audio processing units are secured to the mounting flanges.

18. The audio processing system of claim 17, wherein the display components of the front panel comprise:
 an LED oscilloscope which while active fluctuates between two colors where the LED oscilloscope glows a single color at peak voltages and gradually fades through a combination of the two colors at other voltages between peaks.

19. The audio processing system of claim 17, wherein the user interface controls and labeling of the front panel further comprises:
 a color coding scheme applied ere each of a number of functional groups are provided unique color, the functional groups including:
  control and pitch voltages;
  low frequency modulation sources;
  audio filter down functions;
  audio gain and mixing functions;
  audio sources and oscillators; and
  harmonic content functions.

20. The audio processing system of claim 19, wherein the user interface controls and labeling further comprises:
 printed text is black-on-white;
 outputs are differentiated from inputs with white-on-black printing;
 a frame is printed around a perimeter of the front panel in the color corresponding with the functional group of the audio processing unit;
 rounded rectangles printed around related user interface controls; and
 a block diagram representation of the function and signal flow of the audio processing unit, including all inputs and outputs.

* * * * *